July 26, 1955 I. A. GREENWOOD, JR 2,714,136

STABILIZED DIRECT-COUPLED AMPLIFIER

Filed Feb. 27, 1951 2 Sheets-Sheet 1

INVENTOR.
IVAN A. GREENWOOD, JR

BY H. S. Mackey

ATTORNEY.

July 26, 1955 I. A. GREENWOOD, JR 2,714,136

STABILIZED DIRECT-COUPLED AMPLIFIER

Filed Feb. 27, 1951 2 Sheets-Sheet 2

INVENTOR.
IVAN A. GREENWOOD, JR

BY H. S. Mackey

ATTORNEY.

United States Patent Office 2,714,136
Patented July 26, 1955

2,714,136

STABILIZED DIRECT-COUPLED AMPLIFIER

Ivan A. Greenwood, Jr., Pleasantville, N. Y., assignor to General Precision Laboratory Incorporated, a corporation of New York Application February 27, 1951, Serial No. 212,980

2 Claims. (Cl. 179—171)

This invention pertains to direct-coupled amplifiers of the class which amplify a wide band of frequencies and which have a high degree of linearity of output as respects input. More specifically, the instant invention is directed to such an amplifier stabilized to eliminate zero drift.

One method of attaining a high degree of amplitude linearity is by the use of negative feedback. Such a feedback may be either mechanical, employing servomechanism, or electrical using any of a number of well-known circuits. In either case a degree of stability and linearity is attained which may be very high when certain precautions are observed.

The principal precaution is the neutralization of changes of amplifier zero position so as to stabilize the instrument zero. Such zero changes are inherent in direct-coupled amplifiers, and occur principally because of slow changes in grid-cathode contact potential of the the tubes used, replacement of tubes, and potentials generated in the circuit. This is to say, in direct-coupled amplifiers the zero is inherently unstable and tends to drift. Such changes causing drift of zero are not counteracted by negative feedback, but they are customarily neutralized by making manual changes in a zero adjustment which may be the bias potential adjustment of a tube control electrode. Since in direct-coupled amplifiers this adjustment has always been required to be made manually, and more or less continually, if the amplifier is to be useful for precision work, such amplifiers have required continual attention and they have therefore been of use only under laboratory conditions. As here used drift or zero shift is defined as a variation in amplifier operation which produces a change in output which is independent of the magnitude or variation of the input signal.

The instant invention, however, makes the direct-coupled amplifier automatically self-stabilizing and eliminates manual readjustment of the zero setting. The direct-coupled type of amplifier is thereby made useful as a precision unattended device.

The general procedure followed in the practice of this invention is to sample or abstract the zero signal input voltage level of the direct-coupled amplifier and to compare it with a reference potential in such a way that any zero change that may occur will cause a potential difference, the sampling and comparison operation taking place without interrupting the operation of the amplifier. The difference in potentials is then amplified by a supplementary amplifier by the correct amount and applied to the direct-coupled amplifier in such a manner as to supply exactly the right amount of correction bias, so that the direct-coupled amplifier thereafter operates as it did before the drift or shift had occurred.

The supplementary amplifier for amplifying the potential representing the drift of the instrument zero indication, must itself be free of zero drift in order not to introduce the very error that it is designed to correct. For that reason a contact-modulated amplifier is employed for this purpose consisting of an alternating current amplifier preceded by a chopper and followed by a synchronous rectifier. Such an amplifier combination while limited in its band width characteristics and hence not useful by itself for the applications to which the instant invention is directed, namely, the amplification of signals covering a wide frequency band, nevertheless amplifies direct-current signals and is inherently free of zero drift.

A principal object of this invention therefore is to provide an improved direct-coupled amplifier of superior accuracy that can be operated unattended for extended periods.

A more specific object of this invention is to provide means for automatic and continuous correction of the inherent drift of the zero calibration of a direct-coupled amplifier.

Still another object of this invention is to provide a direct-coupled amplifier having separate automatic means for linearity stabilization and for zero stabilization.

A further object of this invention is, in a direct-coupled amplifier, to compare samples of a potential derived from the input reference level with a potential derived from the output reference level to detect drift or shift of zero adjustment and to generate therefrom a zero-correcting signal.

Another object of this invention is in a high input impedance direct-coupled amplifier, to compare by means of a vibrator two samples of potential derived respectively from the input and output reference levels of the amplifier.

Still another object of this invention is, in a high input impedance direct-coupled amplifier, to compare an error signal with zero potential by means of a vibrating contact, the error signal being the difference between two voltages derived from the input and output voltage levels of the amplifier.

A further understanding of the invention may be secured from the following detailed description together with the drawings, in which:

Figure 1 schematically represents a circuit embodying the invention employing a vibrator comparator.

Figure 1:
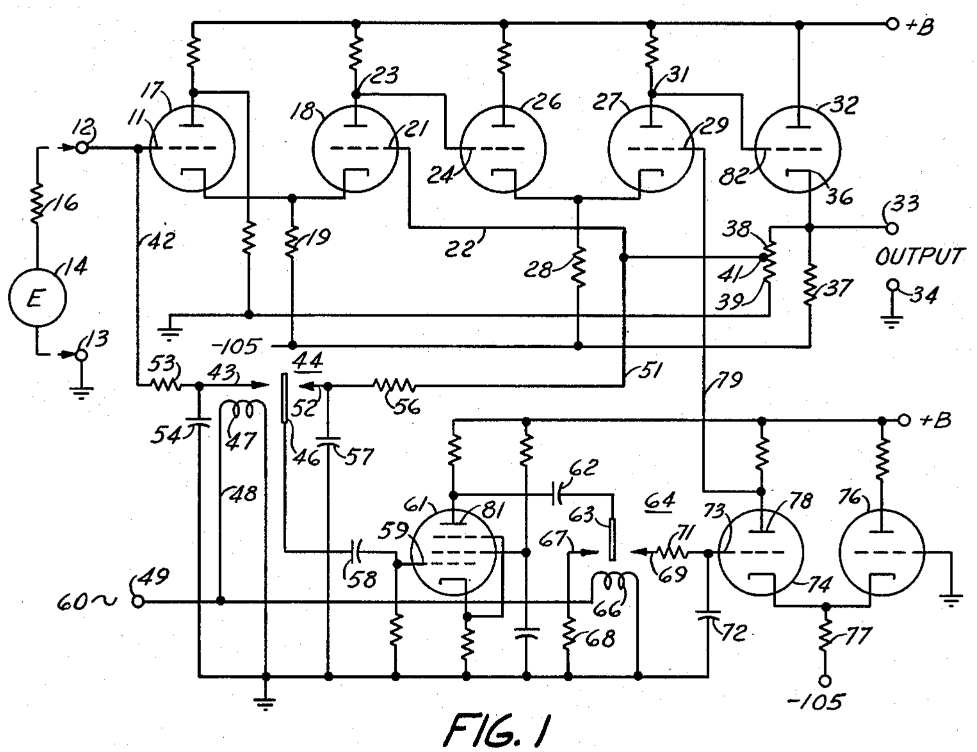

Referring now to Fig. 1, a two-stage balanced direct-coupled amplifier is arranged for excitation at its input control grid 11 from input terminals 12 and 13. The input signal is schematically represented by a generator 14 of a potential E and by a resistor 16 representing the impedance of the signal-generating equipment. Whatever the value of this the impedance of the amplifier is matched thereto as is well understood in the art.

This invention is applicable to many types of direct-coupled amplifier having any number of stages, but for the purpose of illustration an amplifier is chosen having two balanced stages and an output cathode follower. Negative feedback in some form may be provided if desired, to insure stability and linearity.

The first balanced stage employs two tubes 17 and 18 having a cathode coupling resistor 19. The input signal reference or zero level voltage is that of ground, as is indicated at the input terminal 13, but the conjugate grid 21, instead of being returned to ground as has heretofore been standard practice, is connected to conductor 22 for application thereto of degenerative feedback as will be explained later. Single-ended output is taken from the anode terminal 23 to the input grid 24 of the second balanced stage consisting of tubes 26 and 27 coupled by the cathode resistor 28. The grid 29 of this stage, which normally would be returned to a voltage equal to the no-signal voltage level of grid 24, is connected in a manner that will be explained later. The output of this second stage is derived from anode terminal 31, and through the medium of a cathode follower 32 is applied to output terminals 33 and 34. The cathode 36 of the cathode follower tube 32 is connected to a source of negative voltage through a resistor 37 and through a voltage divider consisting of resistors 38 and 39 to ground. The common junction 41 between resistors 38 and 39 is near ground potential so that when the amplifier is supplied with an input signal this terminal 41 is energized with a small fraction of the voltage of the output terminal 33. This fractional signal voltage is designed to be substantially equal to the input signal voltage, and is employed through conductor 22 as the direct-coupled amplifier degenerative feedback voltage, being applied as such to the aforementioned grid 21 to secure signal amplitude linearity and gain stability.

The output voltage can thus be made very linear and gain-stable, but nevertheless the output voltage corresponding to zero input signal may vary due to changes in grid-cathode contact potential in a way which cannot be corrected by a negative feedback circuit.

In order to compensate for any zero shift it is customary to apply voltage to a control electrode, as for instance, the grid 29, through a potentiometer that is made manually adjustable to offset drift errors. In the improvement of the present invention such an adjustment is made automatically by employing a supplementary amplifier of the contact modulated type, which inherently has little or no zero error. This type of amplifier consists of a "converter" or single-pole double-throw vibrator or chopper followed by an alternating current voltage amplifier and a vibrator-type demodulator or rectifier.

The potential of the input grid 11 is periodically sampled by connection thereof through conductor 42 to the contact 43 of a vibrator 44. The vibrator armature 46 is vibrated by a coil 47 which is energized at any convenient low frequency. This frequency may for instance be 60 cycles per second and the coil 47 is accordingly connected through conductor 48 to a terminal 49 supplied with voltage of that frequency. Such a coil is customarily driven from the filament supply voltage, which is omitted from the drawings for clarity. In any case, however, it is desirable, in order to balance supply frequency pickup, to provide an adjustable grounded midtap on both the vibrator coil supply and the filament supply.

The direct-coupled amplifier's output potential is also periodically sampled, being first reduced by the amount of the amplifier gain so that the reduced voltage equals the input signal voltage plus the zero drift. The reduction of the output potential of the terminal 33 is effected by the voltage divider consisting of resistors 38 and 39 and the low voltage is applied from the common junction 41 through conductor 51 to the contact 52. The armature 46 is thus alternately energized by contact 43 and by contact 52.

A low pass filter is connected in series with each contact to prevent 60-cycle components of the input signal from reaching the vibrator, where they would be interpreted as direct-current bias. The input terminal filter consists of a series resistor 53 and shunt condenser 54, and the other filter consists of a series resistor 56 and shunt condenser 57.

The vibrator 44 in sampling the input and output of the direct-coupled amplifier normally receives samples of equal voltage on its fixed contacts. Any inequality will be caused only by amplifier zero shift. When an inequality exists, a rectangular alternating potential is applied to the armature 46 and therefore the vibrator 44 serves not only to sample and compare the applied voltages, but also serves as a direct current to alternating current converter or chopper. In exercising this function the vibrator 44 converts the difference in voltage existing between contacts 43 and 52 to alternating current, in which form it is more conveniently amplified, without the possibility of inserting more zero error.

The vibrator armature 46 is connected through a condenser 58 to the control grid 59 of a tube 61 that serves as an alternating current amplifier. Since the signal applied to the amplifier is derived from the chopper 44, operating at a frequency of 60 cycles per second, no frequencies below this frequency need be amplified. The amplifier pentode 61 is connected through a coupling condenser 62 to the armature 63 of a vibrator-type half-wave rectifier 64 which is actuated by a coil 66 connected in shunt with coil 47. The rectifier 64 therefore vibrates in synchronism with the chopper 44. Alternatively, the rectifier 64 and chopper 44 may consist of two mechanically-connected armatures contained in a single vibrator. One contact 67 of the rectifier 64 is grounded through a low resistance 68 and the output is derived from the contact 69, filtered by a low-pass filter consisting of series resistor 71 and shunt condenser 72 to remove 60-cycle ripple. The condenser 72 is illustrated as grounded but may if desired be connected between the output terminal of resistor 71 and the anode 78 of the following tube, with a consequent reduction in the required capacitance. Amplification is accomplished in a balanced direct-coupled stage comprising tubes 74 and 76 having a common cathode resistor 77, the output of which is derived from the anode 78 and applied through a conductor 79 to the grid 29 of the second stage of the direct-coupled amplifier.

The operation of the supplementary vibrator-input amplifier in neutralizing the zero error of the direct coupled amplifier may be best understood by considering the following signal and potential relationships. When there is no zero shift or drift in the amplifier the potential at the terminal 41 always equals the potential impressed on the input at the grid 11, the circuit being designed for such equality of potentials, and the potentials of the vibrator fixed contacts 43 and 52 are consequently equal. No alternating current potential therefore is impressed through condenser 58 upon the grid 59, and the anode 81 is maintained at a steady potential determined by the circuit design. Under such circumstances when the rectifying armature 63 engages the contact 67 the output side of condenser 62 is grounded, discharging it to what may be called its normal state. When the vibrating armature 63 next engages the contact 69 it applies this normal or ground potential to the grid 73 and the circuit components are so proportioned that this action in turn results in the potential of the anode 78 being maintained at what may be termed a normal value. This normal value potential is impressed on the grid 29 of tube 27 through the conductor 79 and in the absence of drift in the amplifier the normal value potential is such that with zero signal input the signal output at terminal 33 is at ground potential.

If, however, a zero drift occurs in the direct-coupled amplifier such change may produce, for instance, a small positive signal at the output terminal 33, thus acting as if a positive input signal had been applied to the amplifier when in fact there is no input signal. The terminal 41 therefore becomes positive as respects ground, and this positive potential is applied to the vibrator contact 52. When, therefore, the armature 46 engages the contact 52 the positive potential thereof is applied to the grid 59, causing a reduction of the potential of the anode 81. This reduction in potential is transmitted as a negative charge through condenser 62 to the rectifier armature 63, and as the armatures 46 and 63 vibrate to right and left in concert, the negative charge is transmitted through contact 69 to the grid 73 of tube 74. This action results in an increase in potential of the anode 78 and hence of the grid 29 connected thereto producing in turn a decrease in potential of the anode terminal 31 of the tube 27, grid 82 and cathode 36 of the tube 32 and terminal 33. The circuit components are so selected and proportioned that this decrease in potential of the output terminal 33 substantially neutralizes the increase in potential of the terminal which produced the action in the first place. This consequent reduction in potential of the terminal 33 in turn is accompanied by a proportional reduction in potential of the terminal 41, and of the contact 52 connected thereto, so that the correcting action herein described is self-terminating.

Figure 2:
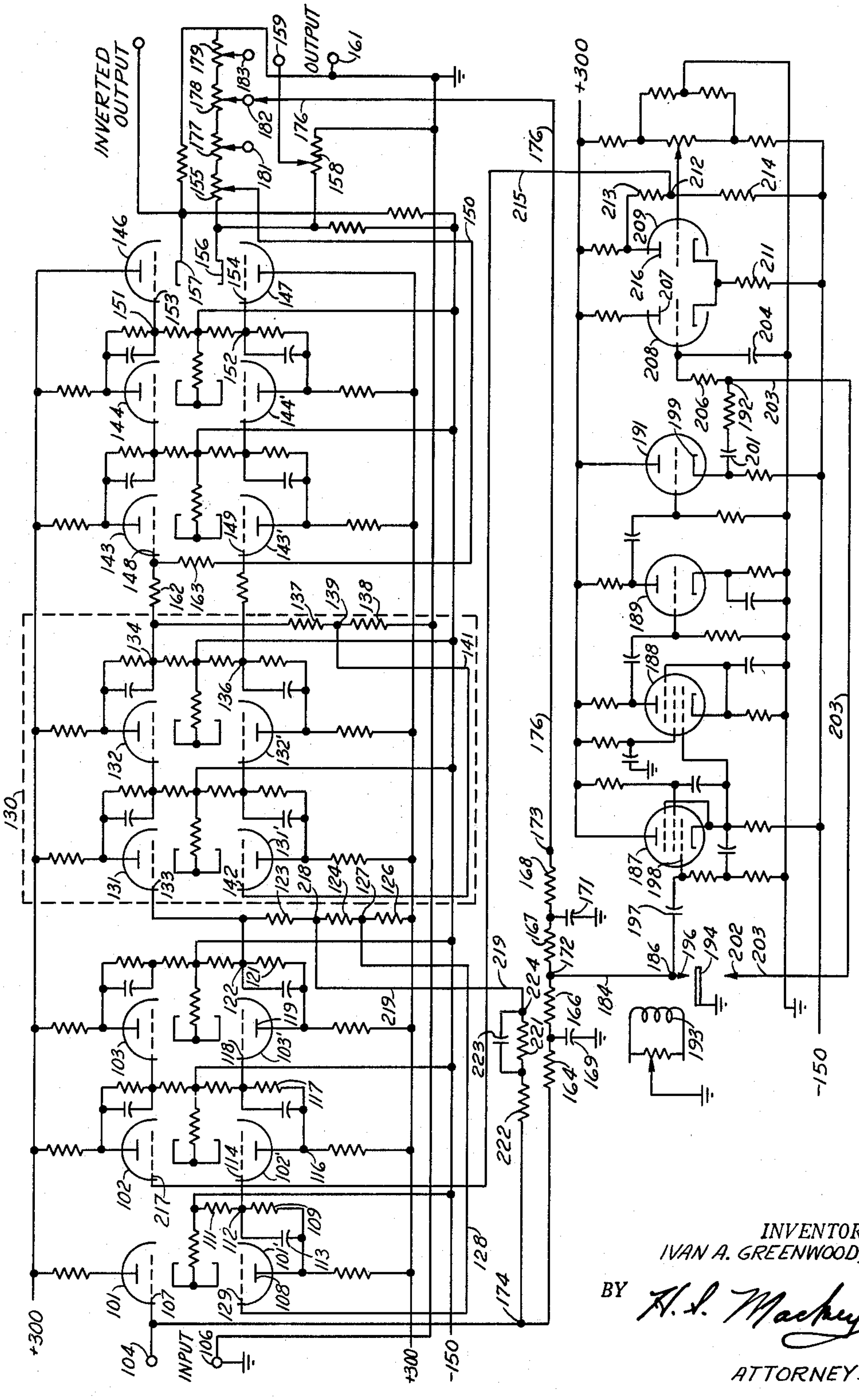
Figure 2 depicts a circuit embodying the invention which employs an impedance network comparator.

The embodiment illustrated in Fig. 2 is preferred when a high input impedance is required. In this form of the invention higher input impedance is secured by segregating the comparator function of the supplementary amplifier input from its chopper function. In this embodiment of the invention a high-gain direct-coupled amplifier is employed and to reduce any tendency to self-oscillation such amplifier is divided into several sections, each having its own negative feedback to secure amplitude linearity and stability, the several sections consisting of an input section, an output section and one or more identical intermediate sections, only one of such intermediate sections being shown for the sake of simplicity.

The input section is composed of three dual tubes 101, 101′, 102, 102′, 103 and 103′, although if desired two separate electrometer tubes may be substituted for the tube sections 101 and 101′ producing some increase in the instrument input impedance. Two input signal terminals 104 and 106 are provided, terminal 106 being connected to a desired reference voltage here designated as ground potential. All high impedance portions of this circuit, such as input conductors, are adequately shielded and spaced physically from other portions of the circuit, with suitable shields and ground connections as is conventional in high impedance circuits. The terminal 104 is connected to the grid 107 of tube 101 and the first-stage output potential is derived from the anode 108 of the conjugate tube 101′. The anode 108 is connected to a source of negative potential through resistors 109 and 111 in order to limit its maximum potential and to define the no-signal grid potential of the following stage, which is secured from the junction 112. Condenser 113 and other condensers in like locations in the amplifier are provided to neutralize tube grid and wiring capacity, such as that of tube 102′, in order to make the amplifier gain constant throughout its frequency range and if desired these condensers may be made variable for greater accuracy. The signal derived from the junction 112 is applied to grid 114 of tube 102′, and from the anode terminal 116 thereof through resistor 117 to the grid 118 of tube 103′. The output of the first section is obtained from the anode 119 of tube 103′ through a resistor 121, the output terminal 122 of which is connected to ground through a voltage divider consisting of three resistors 123, 124 and 126 connected in series. The resistors 123, 124 and 126 are so chosen and so proportioned as respects each other that the potential at the junction 127 is equal to the output potential of the first section divided by the gain of that section and consequently is equal to the input signal potential applied to the grid 107 of the input tube 101. This potential, which is of the same polarity as that of the input signal potential, is applied through a conductor 128 to the grid 129 of tube 101′ and serves as degenerative feedback which stabilizes the gain and linearizes the first amplifier section.

The second or intermediate amplifier section 131 consists of two balanced direct-coupled stages comprising tubes 131, 131′, 132 and 132′. The input signal therefore obtained from the terminal 122 is applied to the grid 133 of tube 131, and a balanced output is derived from the second stage anode divider terminals 134 and 136. A voltage divider consisting of resistors 137 and 138 is connected between the output terminal 134 and ground, and the junction 139 thereof is connected degeneratively through conductor 141 to the grid 142 of tube 131′.

Any reasonable additional number of amplifier sections identical with the section 131 can be placed in tandem therewith to increase the direct-coupled amplifier gain to any desired amount.

The final section includes two direct-coupled balanced stages comprising tubes 143, 143′, 144 and 144′, and output cathode followers 146 and 147. Balanced input signals obtained from the terminals 134 and 136 of the second amplifier section 131 are applied to the input grids 148 and 149, and balanced output signals are derived from the final stage voltage divider terminals 151 and 152. These output signals are applied to the grids 153 and 154 of the two cathode follower tubes 146 and 147, so that signals of opposite polarity are secured between their respective cathodes 156, 157 and ground. The cathode 156 is opposite in polarity to that of the input signal grid 107, and consequently its output is employed as input to the drift stabilization or supplementary amplifier in a manner that will be explained later. Since the voltage of the cathode 156 is thus employed as a stabilization reference, it is somewhat more accurate than the cathode 157 output voltage, and consequently is employed to energize the output terminal 159 through a gain control potentiometer 158, the other output terminal 161 being placed at ground potential. A negative feedback conductor 150 is connected from the variable cathode resistor 155 to the input grid 148, being isolated from the input signal secured from the amplifier section 131 by two resistors 162 and 163.

The device for comparing the input and output signal levels consists of four resistors 164, 166, 167 and 168, connected in series between the input terminal 104 and an output terminal 173 and two equal capacitors 169 and 171 connected between the juncture of the resistors and ground. The comparator so formed is symmetrical about its midterminal 172, the resistors 164 and 168 having equal high resistance which is materially higher than the resistance of the source of input data. The resistances of resistors 166 and 167 is made equal but lower than that of 164 and 168, although not so low as to reduce the supplementary amplifier gain too much. The capacitances of the capacitors 169 and 171 is high enough so that they, in cooperation with the resistors, attenuate the chopper frequency considerably. The resistors 164 and 166 and capacitor 169 constitute a low-pass filter permitting only low frequency and direct current components of the energy received from input terminal 104 to be effective at the terminal 172. The resistors 167 and 168 and capacitor 171 likewise constitute a low-pass filter for input energy applied to the terminal 173.

The comparator is designed to compare two voltages and at balance the magnitudes of the voltages applied to its two end terminals 173 and 174 are designed to be equal. To that end voltage is applied to the terminal 173 through conductor 176 from a voltage divider comprising several voltage dividers 177, 178, and 179, and a tap switch having several taps 181, 182, and 183. A switch tap is selected corresponding to the number of amplifier intermediate sections employed and the voltage divider connected to that tap is adjusted so that the fraction of output voltage thus selected is exactly equal to the input voltage at terminal 104 which is applied to the grid 107 and the comparator terminal 174. However, the voltage applied to the terminal 173, although equal at balance to that applied to terminal 174, is of opposite polarity, with the result that at balance the potential of the midpoint 172 is zero with respect to that of terminal 106.

The potential of the midterminal 172 is applied through conductor 184 to the input terminal 186 of a supplementary amplifier comprising an input vibrator or chopper, three alternating current amplifier stages represented by tubes 187, 188 and 189, an output cathode follower tube 191, and an output synchronous rectifier. The direct-current or low-frequency signal applied to this amplifier is first interrupted, the resulting alternating voltage amplified, and the amplified voltage rectified to direct current which appears at the output terminal 192.

The vibrator or chopper is designed for operation at any convenient low frequency, for instance any frequency between one cycle per minute and 400 cycles per second. For the purpose of example 60 C. P. S. is chosen and the vibrator coil 193 is operated from a 60-cycle source. The coil is provided with an adjustable center tap connected to ground to balance pick-up of hum from the supply source by the high impedance input circuits of the instrument. The vibrator or chopper comprises a grounded armature 194 and a fixed contact 196 connected to the input terminal 186, so that alternate grounding and opening of the contact produces at the input terminal 186 a rectangular voltage form alternating between zero and the error signal value. Therefore, at balance, that is when no zero drift error exists and the terminal 172 is at zero, no alternating voltage is produced. However, if a zero drift error exists the fractional output voltage impressed on the comparator terminal 173 will differ from the input voltage impressed on 174, and the voltage of the center terminal 172 will be different from zero. The voltage of the contact 196, when open, then differs from zero but is zero when grounded resulting in an alternating voltage.

The connecting of the armature 194 directly to ground has been found to have some practical importance, in rendering unnecessary any shielding of the armature to avoid pick-up of stray alternating current fields thereby and in permitting the use of a single vibrator as a chopper and rectifier.

It is, of course, to be understood that throughout this specification wherever the term ground is used it means a common bus bar without necessarily including an earth connection.

The alternating voltage resulting from the vibrator action is impressed through condenser 197 upon the grid 198 of tube 187, and after amplification in the several stages of the supplementary amplifier is applied to the cathode follower 191. Consequent alternations of voltage at the cathode 199 thereof are impressed on condenser 201. This condenser is synchronously grounded by the armature 194 of the vibrator through its fixed contact 202 and conductor 203 for one-half of each cycle, so that a resultant direct voltage, pulsating at the vibrator frequency is present at the terminal 192. The combination of the armature 194 and contact 202 thus serves as a half-wave rectifier operating in synchronism with the chopper.

The resulting slowly varying voltage is smoothed by a low pass filter consisting of condenser 204 and resistor 206. This filter has a large time constant so that even though the rectification is of the half-wave type, relatively pure direct current free of the vibrator frequency is obtained. In order to employ a reasonably small condenser the resistor 206 has a large resistance to secure the requisite large time constant. Still further reduction in the size of the condenser 204, or increased filtering action is secured if the condenser return is to the anode 207 of tube 208 instead of to ground.

The rectifier and filter are followed by a single balanced stage of direct-coupled amplification comprising tubes 208 and 209 coupled by a common cathode resistor 211. The gain of this stage offsets the loss of half-wave rectification. Output is taken from the common junction 212 of two resistors 213 and 214 connected in series between the anode 216 and a source of negative potential to secure the requisite direct current voltage level. The output voltage is led from junction 212 through conductor 215 to the control grid 217 of tube 102 in the second stage of the direct-coupled amplifier.

In operation, the supplementary amplifier when excited by an error signal representing the difference between the input signal applied to the direct-coupled amplifier and its output signal divided by its gain, applies a signal to the direct-coupled amplifier grid 217 of such polarity as to make its output signal divided by its gain substantially equal the input signal impressed thereon. This brings the error signal to substantially zero. Thus the action of the comparator and of the supplementary amplifier substantially neutralizes zero or drift error in the direct-coupled amplifier.

The complete separation of the instrumentalities for incremental stabilization of the direct-coupled amplifier from instrumentalities for zero stabilization is an important objective of this invention, and permits use of better design in each part.

The stabilized amplifier of Fig. 2 as so far described presents high impedance to incoming signals, but by an expedient can be made of still higher impedance. Input impedance depends upon the current drain of the first tube grid 107 and upon the current drain into the comparator at its first resistor 164. The latter is made zero at balance in the following manner.

An auxiliary source of potential which at balance is exactly equal to twice the potential of the input signal is secured by a tap at the common junction 218 of resistors 123 and 124, these resistors being suitably proportioned. This potential is led by conductor 219 to two resistors 221 and 222 connected in series, resistor 221 being shunted by a condenser 223 and the other end of resistor 222 being connected to terminal 174. The resistance of resistor 221 is made equal to that of resistor 166 and the resistance of 222 to that of 164, while the capacitance 223 equals that of capacitance 169. Therefore the impedance network formed between the terminals 224 and 172 is symmetrical about the terminal 174, and a potential of double the input signal value applied to terminal 224 results in a potential at the terminal 174 equal at balance to that of the input signal. When this is the case, the impedance at terminal 174 appears to the incoming signals to be infinite, and the only finite impedance left is that of the control grid 107. This can be made very high by known procedures, such as by employing an electrometer tube as the tube 101.

Figure 3:
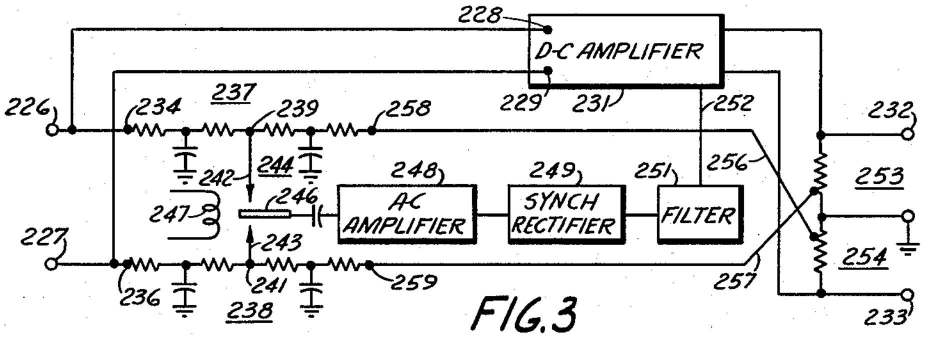
Figure 3 illustrates employment of the invention in a balanced amplifier.

The circuit of Fig. 3 is similar to that of Fig. 2 except that it is constructed for a balanced input. An input signal is applied between input terminals 226 and 227 so that they have instantaneous opposite polarities. These terminals are connected to the input terminals 228 and 229 of a balanced direct-coupled amplifier 231 having balanced output terminals 232 and 233. This amplifier has internal negative feedback and is also otherwise similar to the direct-coupled amplifier of Fig. 2 except that it is double-ended at its input and output. The input terminals 226 and 227 are also connected to the end terminals 234 and 236 of two comparator networks 237 and 238, each consisting of four resistors and two condensers and being similar to the comparator of Fig. 2 and having similar functions. The midterminals 239 and 241 are connected respectively to the two fixed contacts 242 and 243 of a vibrator 244 having an armature 246. This vibrator has a coil 247 operating on 60 C. P. S. supply, and is in all respects like the vibrator of Fig. 2 except in its fixed contact connections. It has the functions of sampling and of chopping or interrupting the signals supplied to it to prepare them for amplification by a following alternating current amplifier 248. The amplifier 248 is in turn followed by a synchronous rectifier 249 and filter 251 similar to those of Fig. 2, and a direct-current differential drift-correcting potential is applied through conductor 252 to the amplifier 231 as in Fig. 2. Voltage-reducing dividers 253 and 254 connected between the amplifier output terminals and ground each have a ratio equal to the amplifier gain, and supply through conductors 256 and 257 equal and opposite potentials to the comparator network terminals 258 and 259. As will be readily apparent operation of this stabilized balanced-input direct-coupled amplifier is completely analogous to that of the amplifier of Fig. 2.

Figure 4:
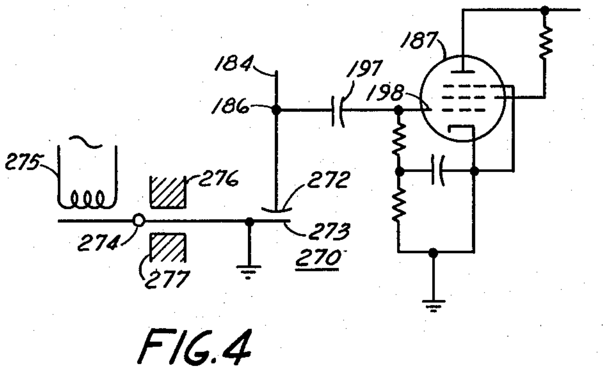
Figure 4 is an illustration of a modification of a portion of the circuit of Fig. 2.

For applications where the impedance of the signal source is extremely high, the modification illustrated in Fig. 4 may be utilized. In such instances electrometer tubes of the best quality are used in the direct-coupled amplifier and a capacitance modulator 270 is used in place of the input chopper or interrupter of Fig. 2. This capacity modulator may conveniently consist of a fixed plate 272 and a grounded movable plate 273. The movable plate is oscillated about a pivot 274 by a coil 275 its oscillatory movement being limited by the fixed stops 276 and 277. In other respects the circuitry may be the same as is illustrated in Fig. 2 and hence repetitious illustration thereof is omitted.

What is claimed is:

1. An amplifier of the character described comprising, a direct-coupled amplifier including a plurality of amplifier stages, means for impressing a control signal potential on the input thereof, a degenerative feedback circuit therefor, means connected to a terminal of said direct-coupled amplifier located at a point subsequent to at least the first stage thereof for deriving therefrom a reference potential the magnitude of which is equal to the signal developed at that point divided by the gain of the direct-coupled amplifier up to that point, a first balanced series resistor network having said control signal potential impressed on one end thereof and said reference potential impressed on the other end thereof, an alternating current amplifier having its input connected to the electrical midpoint of said first series resistor network, means connected to an intermediate terminal of said direct-coupled amplifier for deriving therefrom a potential whose amplitude is double that of said control signal potential, a second resistor network having said double amplitude potential impressed on one end and the other end connected to the control signal potential terminal of said first resistor network, the resistance of said second resistor network being equal to the resistance of that portion of said first resistor network included between said control signal terminal and said electrical midpoint, means for periodically grounding said electrical midpoint whereby the signal input of said alternating current amplifier alternates between potential limits defined by ground and the potential of said electrical midpoint, means for converting the output signal of said alternating current amplifier to a direct current signal, and means controlled by said direct current signal for adjusting the static potential of a selected portion of said direct-coupled amplifier to compensate for the zero drift thereof.

2. An amplifier of the character described comprising, a direct-coupled amplifier, means for impressing a control signal potential on the input thereof, a degenerative feedback circuit therefor, means coupled to the output of said direct-coupled amplifier for deriving therefrom a reference potential whose amplitude is equal to the output signal of said direct-coupled amplifier divided by the gain thereof, a first balanced series resistor network having said control signal potential impressed on one end thereof and said reference potential on the other end thereof, an alternating current amplifier having its input connected to the electrical midpoint of said first series resistor network, means connected to an intermediate terminal of said direct-coupled amplifier for deriving therefrom a potential whose amplitude is double that of said control signal potential, a second resistor network having said double amplitude potential impressed on one end and the other end connected to the control signal potential terminal of said first resistor network, the resistance of said second resistor network being equal to the resistance of that portion of said first resistor network included between said control signal terminal and said electrical midpoint, means for periodically grounding said electrical midpoint whereby the signal input of said alternating current amplifier alternates between potential limits defined by ground and the potential of said electrical midpoint, means for converting the output signal of said alternating current amplifier to a direct current signal, and means controlled by said direct current signal for adjusting the static potential of a selected portion of said direct-coupled amplifier to compensate for the zero drift thereof.

References Cited in the file of this patent

UNITED STATES PATENTS 2,619,552 Kerns ---------------- Nov. 25, 1952